US009459489B2

(12) United States Patent
Ryu et al.

(10) Patent No.: US 9,459,489 B2
(45) Date of Patent: Oct. 4, 2016

(54) LIQUID CRYSTAL DISPLAY, MANUFACTURING METHOD OF THE SAME, AND REPAIR METHOD OF THE SAME

(71) Applicant: Samsung Display Co., Ltd., Yongin, Gyeonggi-Do (KR)

(72) Inventors: Soo-Hye Ryu, Gyeonggi-do (KR); Myungjin Lee, Hwaseong-si (KR); Yun Ho Lee, Cheonan-si (KR); Chul Huh, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/276,813

(22) Filed: May 13, 2014

(65) Prior Publication Data

US 2015/0124204 A1 May 7, 2015

(30) Foreign Application Priority Data

Nov. 1, 2013 (KR) ........................ 10-2013-0132305

(51) Int. Cl.
*G02F 1/1335* (2006.01)
*G03F 7/00* (2006.01)
*G02B 5/22* (2006.01)
*G02F 1/1362* (2006.01)

(52) U.S. Cl.
CPC ....... *G02F 1/133516* (2013.01); *G03F 7/0007* (2013.01); *G02B 5/223* (2013.01); *G02F 2001/136222* (2013.01)

(58) Field of Classification Search
CPC .......... G03F 7/0007; G02F 1/133514; G02F 1/133516; G02F 1/133512; G02F 1/1309; G02F 2001/133519; G02B 5/201; G02B 5/22; G02B 5/223

USPC .................... 430/7; 349/106, 192; 445/2, 24
See application file for complete search history.

(56) References Cited

U.S. PATENT DOCUMENTS

| 7,259,789 B1 | 8/2007 | Endo et al. |
| 2002/0027128 A1 | 3/2002 | Cheng et al. |
| 2004/0209184 A1* | 10/2004 | Hatakeyama ..... G02F 1/133512 430/199 |
| 2006/0181672 A1* | 8/2006 | Son ............................... 349/192 |
| 2013/0258259 A1* | 10/2013 | Nakai ........................... 349/106 |

FOREIGN PATENT DOCUMENTS

| JP | 06-175121 | 6/1994 |
| JP | 2001-074926 | 3/2001 |
| JP | 2003-294932 A | * 10/2003 |

(Continued)

OTHER PUBLICATIONS

Computer-generated translation of JP 2003-294932 (Oct. 2003).*

*Primary Examiner* — John A McPherson
(74) *Attorney, Agent, or Firm* — Innovation Counsel LLP

(57) ABSTRACT

A liquid crystal display includes a first substrate that includes a plurality of pixels, a second substrate facing the first substrate that includes a plurality of color filters, a position of each color filter on the second substrate respectively corresponding to a position over one of the pixels and a black matrix disposed between the color filters, and a liquid crystal layer disposed between the first substrate and the second substrate. The plurality of color filters includes a red color pixel displaying a red color, a green color pixel displaying a green color, and a blue color pixel displaying a blue color. The green color pixel includes a yellow portion including a yellow pigment and a green portion disposed on the yellow portion and including a green pigment.

26 Claims, 10 Drawing Sheets

(56) References Cited

FOREIGN PATENT DOCUMENTS

| | | |
|---|---|---|
| JP | 2006-078766 | 3/2006 |
| JP | 2008-203666 | 9/2008 |
| KR | 10-2005-0025658 A1 | 3/2005 |
| KR | 10-2013-0037446 A | 4/2013 |

* cited by examiner

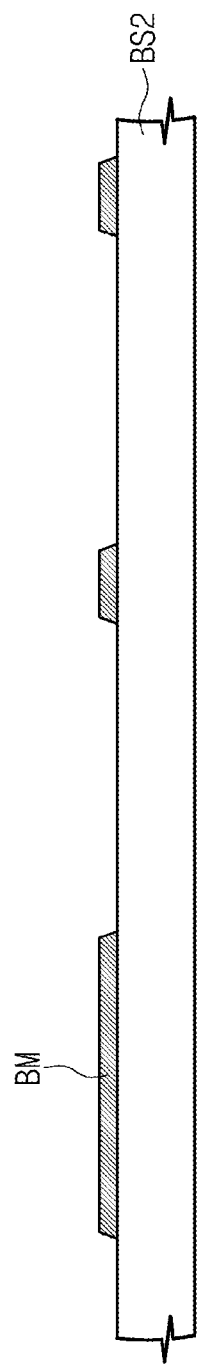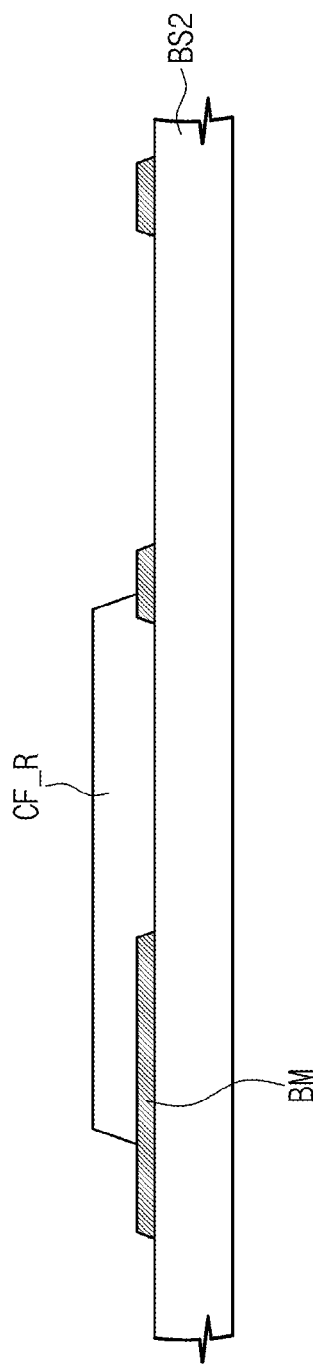

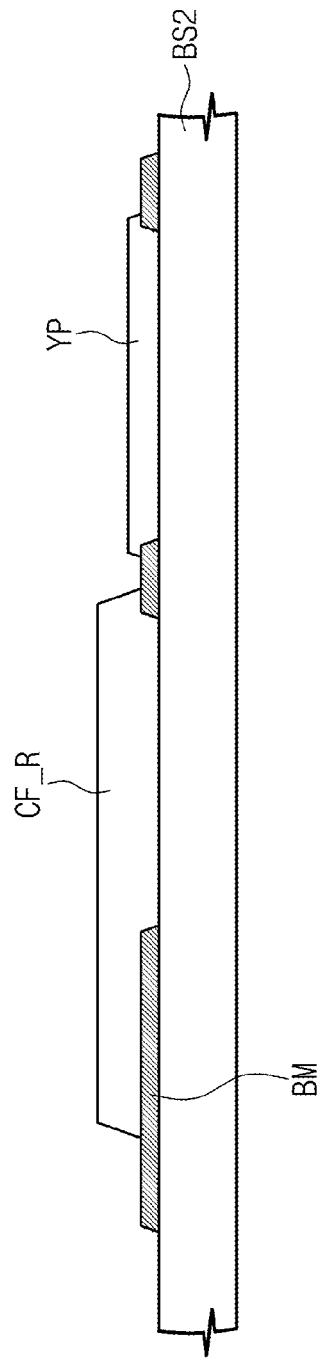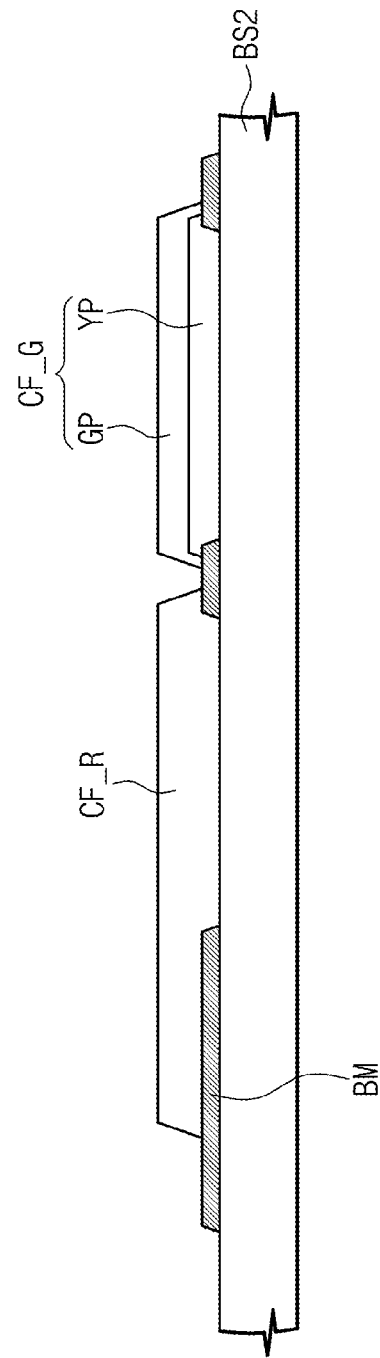

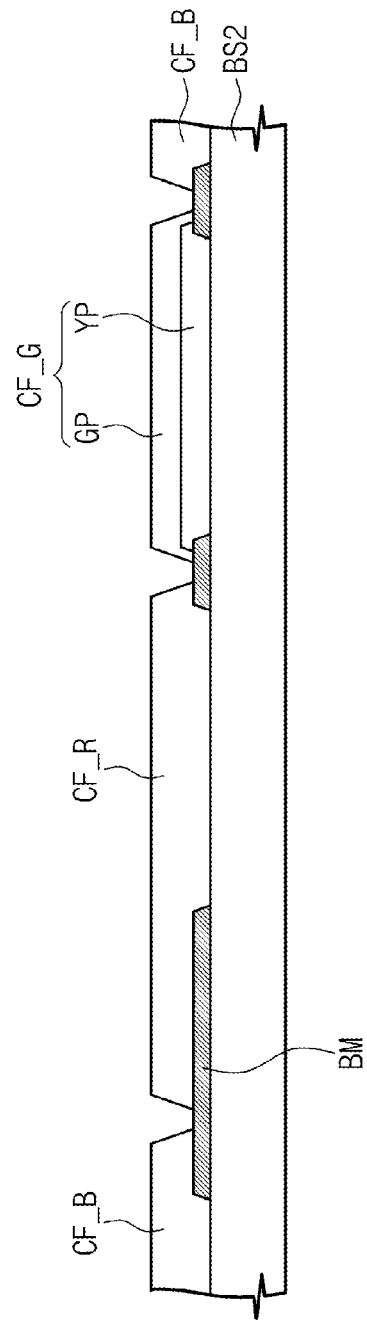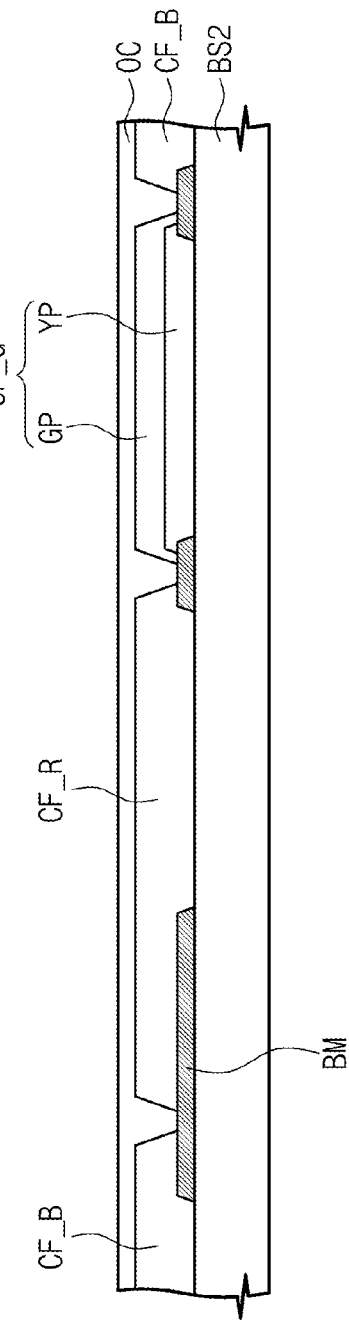

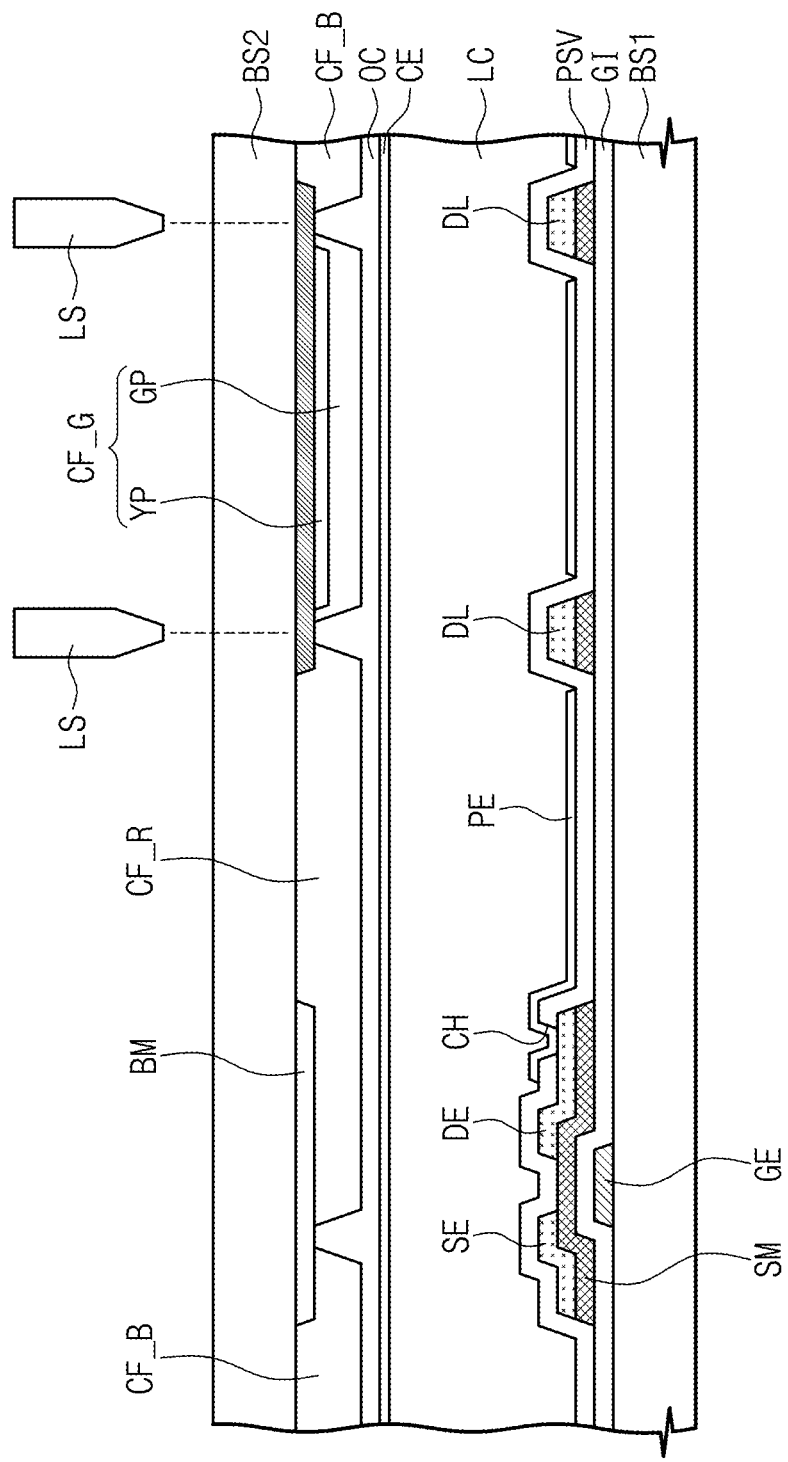

LIQUID CRYSTAL DISPLAY, MANUFACTURING METHOD OF THE SAME, AND REPAIR METHOD OF THE SAME

CROSS-REFERENCE TO RELATED APPLICATION

This U.S. non-provisional patent application claims priority under 35 U.S.C. §119 of Korean Patent Application No. 10-2013-0132305, filed on Nov. 1, 2013, the contents of which are hereby incorporated by reference in its entirety.

BACKGROUND

1. Field of Disclosure

The present disclosure relates to a liquid crystal display, a method of manufacturing the liquid crystal display, and a method of repairing the liquid crystal display.

2. Description of the Related Art

In general, a liquid crystal display includes a first substrate including a plurality of pixel electrodes, a second substrate including a common electrode, and a liquid crystal layer interposed between the first and second substrates. The liquid crystal display controls the transmittance of light passing through the liquid crystal layer in accordance with an electric field formed between the common electrode and each pixel electrode to display a desired image. The liquid crystal display includes a plurality of pixels each including the pixel electrode.

When a defect occurs in a portion of the pixels and the defective pixel is abnormally operated, a repair process is performed on the defective pixel. In general, the defective pixel becomes a dark point by partially connecting or cutting a line part using a laser beam. In this case, however additional defects, e.g., circuit short or open in the line part, occur, and a success rate of the repair process is too low.

SUMMARY

The present disclosure provides a display apparatus capable of providing an image of high quality and easily repairing a defective pixel.

The present disclosure provides a method of manufacturing the display apparatus.

The present disclosure provides a method of repairing a defective pixel of the display apparatus.

In one aspect, a liquid crystal display includes a first substrate that includes a plurality of pixels, a second substrate that faces the first substrate, and a liquid crystal layer disposed between the first substrate and the second substrate. The second substrate including a plurality of color filters, a position of each color filter on the second substrate respectively corresponding to a position over one of the pixels, and a black matrix disposed between the color filters. A liquid crystal layer disposed between the first substrate and the second substrate. The plurality of color filters includes a red color pixel displaying a red color, a green color pixel displaying a green color, and a blue color pixel displaying a blue color, and the green color pixel includes a yellow portion including a yellow pigment and a green portion disposed on the yellow portion and including a green pigment.

The second substrate may include a base substrate on which the color filters are disposed and the yellow portion may be disposed between the base substrate and the green portion.

The yellow portion may include at least one of pigments represented by the following chemical formulas 1 and 2.

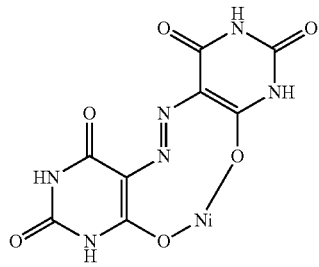

Chemical formula 1

Chemical formula 2

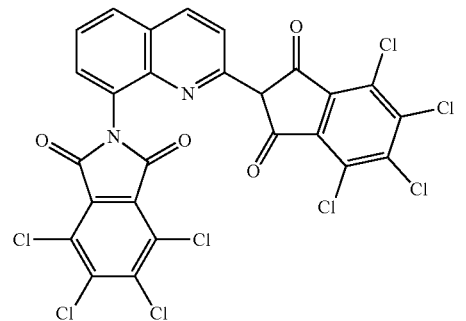

The green portion may include a halogenated phthalocyanine pigment, and the halogenated phthalocyanine pigment may include at least one of pigments represented by the following chemical formulas 3 and 4.

Chemical formula 3

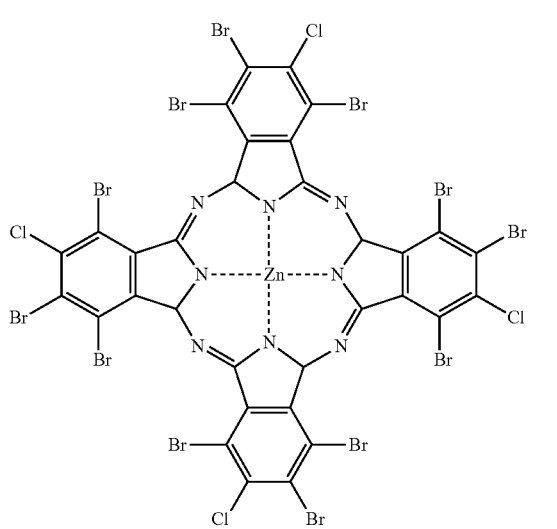

-continued

Chemical formula 4

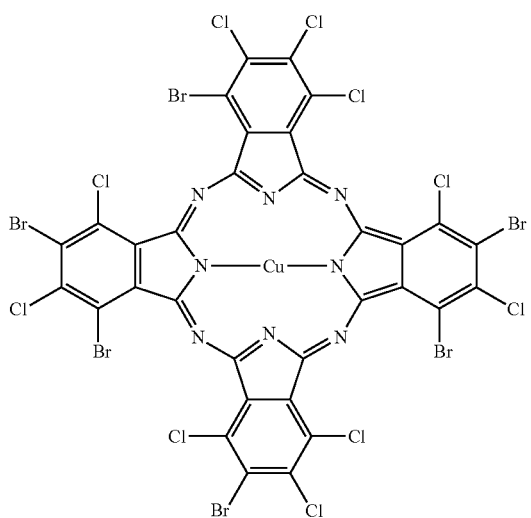

Each of the red color pixel and the blue color pixel may have a single-layer structure.

In another aspect, a method of manufacturing a liquid crystal display includes forming a first substrate including a plurality of pixels, forming a second substrate, and forming a liquid crystal layer between the first substrate and the second substrate. The forming of the second substrate includes forming a black matrix on a base substrate and forming a plurality of color filters, the color filters including a red color pixel, a green color pixel, and a blue color pixel, on the base substrate. The forming of the green color pixel includes forming a yellow portion including a yellow pigment on the base substrate and forming a green portion including a green pigment on the yellow portion.

The color filters may be by an inkjet method, a coating method, or a photolithography method.

In yet another aspect, a method of repairing the liquid crystal display includes identifying a defective pixel among the plurality of pixels and covering the color filter corresponding to the defective pixel using the black matrix.

The covering of the color filter using the black matrix may include applying a laser beam to a region between the base substrate and the color filter to form a gap between the base substrate and the color filter and applying the black matrix disposed adjacent to the gap to fill the gap with the black matrix.

In yet another aspect, a liquid crystal display includes a first substrate that includes a plurality of pixels, a second substrate that faces the first substrate, and a liquid crystal layer disposed between the first substrate and the second substrate. The second substrate includes a plurality of color filters, each color filter positioned on the second substrate over a respectively corresponding pixel, a black matrix disposed between the color filters, and a repair portion overlapped with at least one of the color filters and including a same material as the black matrix. The color filters include a red color pixel displaying a red color, a green color pixel displaying a green color, and a blue color pixel displaying a blue color and the green color pixel includes a yellow portion including a yellow pigment and a green portion disposed on the yellow portion and including a green pigment.

According to the above, the liquid crystal display provides the image of high quality and easily repairs the defective pixel. In addition, when the defective pixel is generated in the liquid crystal display, the defective pixel may be repaired without causing additional defects.

BRIEF DESCRIPTION OF THE DRAWINGS

The above and other advantages of the present disclosure will become readily apparent by reference to the following detailed description when considered in conjunction with the accompanying drawings wherein:

FIGS. 4A, 4B, 4C, 4D, 4E, 4F, and 4G are cross-sectional views showing a manufacturing method of a second substrate according to an example embodiment of the present disclosure; and FIGS. 5A, 5B, and 5C are cross-sectional view showing a repairing method of a defective pixel in the liquid crystal display according to an example embodiment of the present disclosure.

DETAILED DESCRIPTION

Figure 1:
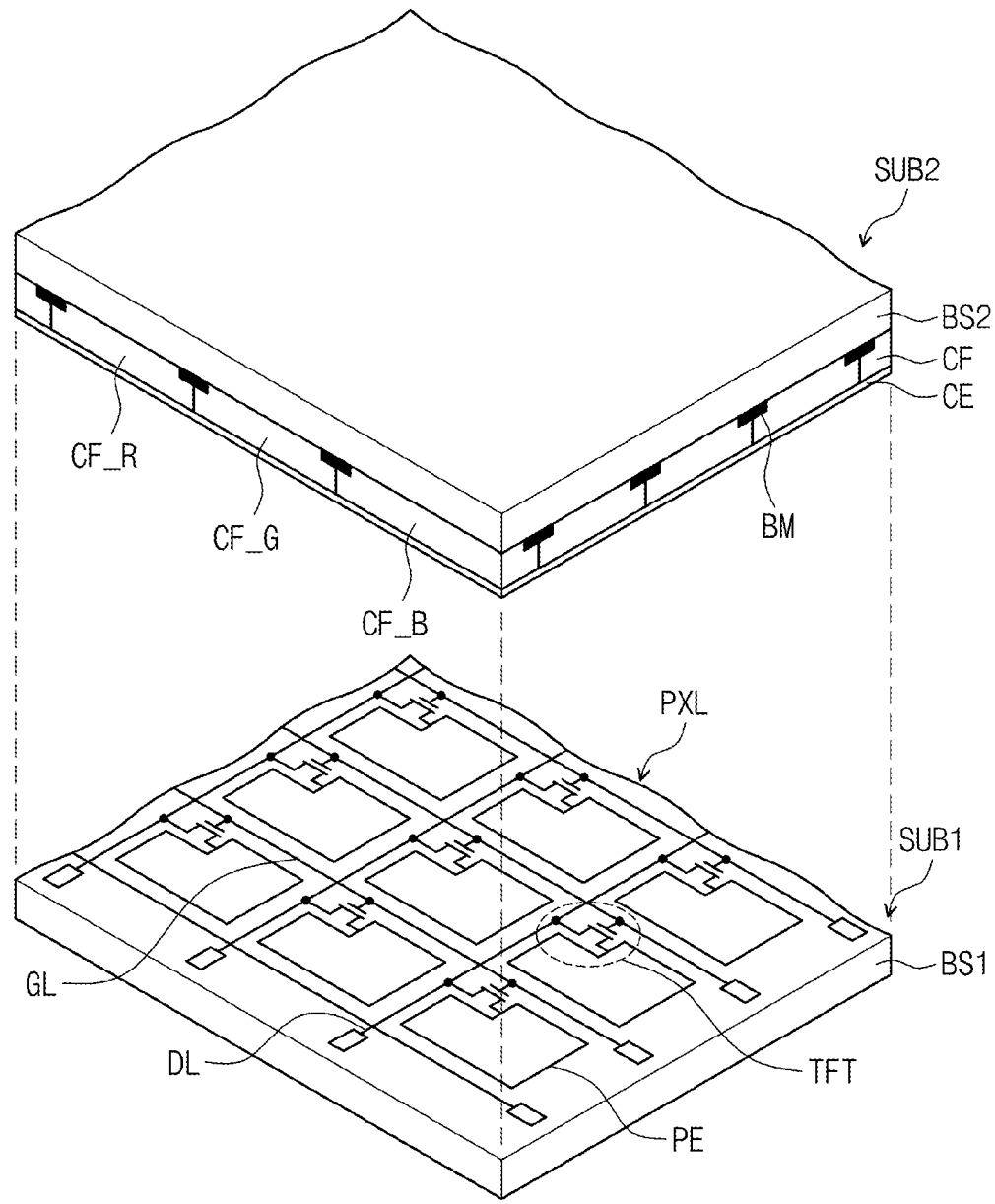
FIG. 1 is an exploded perspective view showing a liquid crystal display according to an example embodiment of the present disclosure.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below, depending on the orientation of the device. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the relevant art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the example embodiments will be explained in detail with reference to the accompanying drawings.

Figure 2:
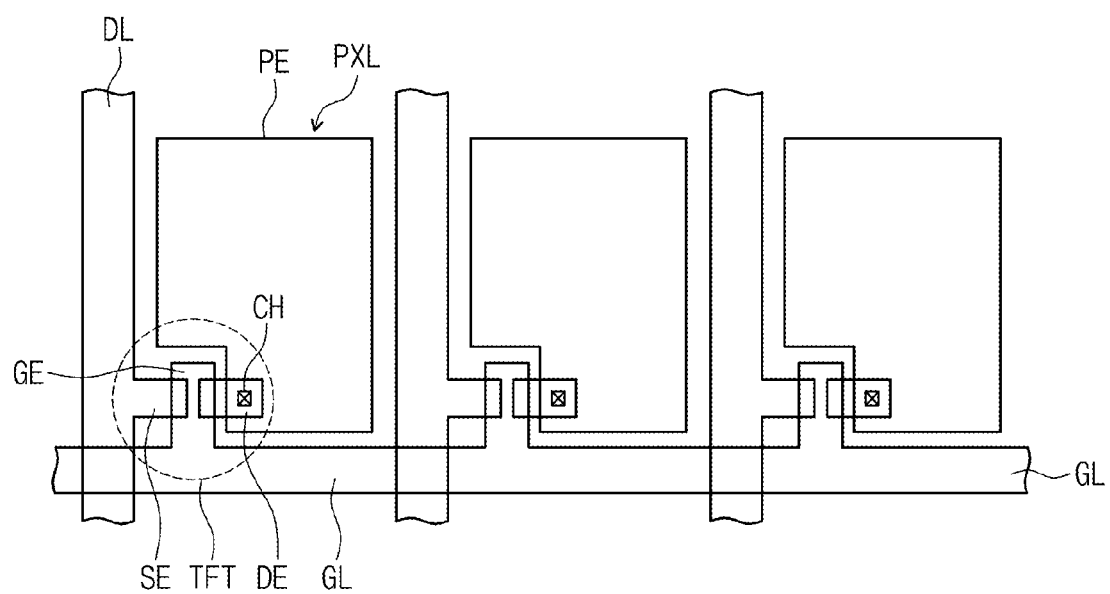
FIG. 2 is a plan view showing a portion of pixels shown in FIG. 1.
Figure 3:
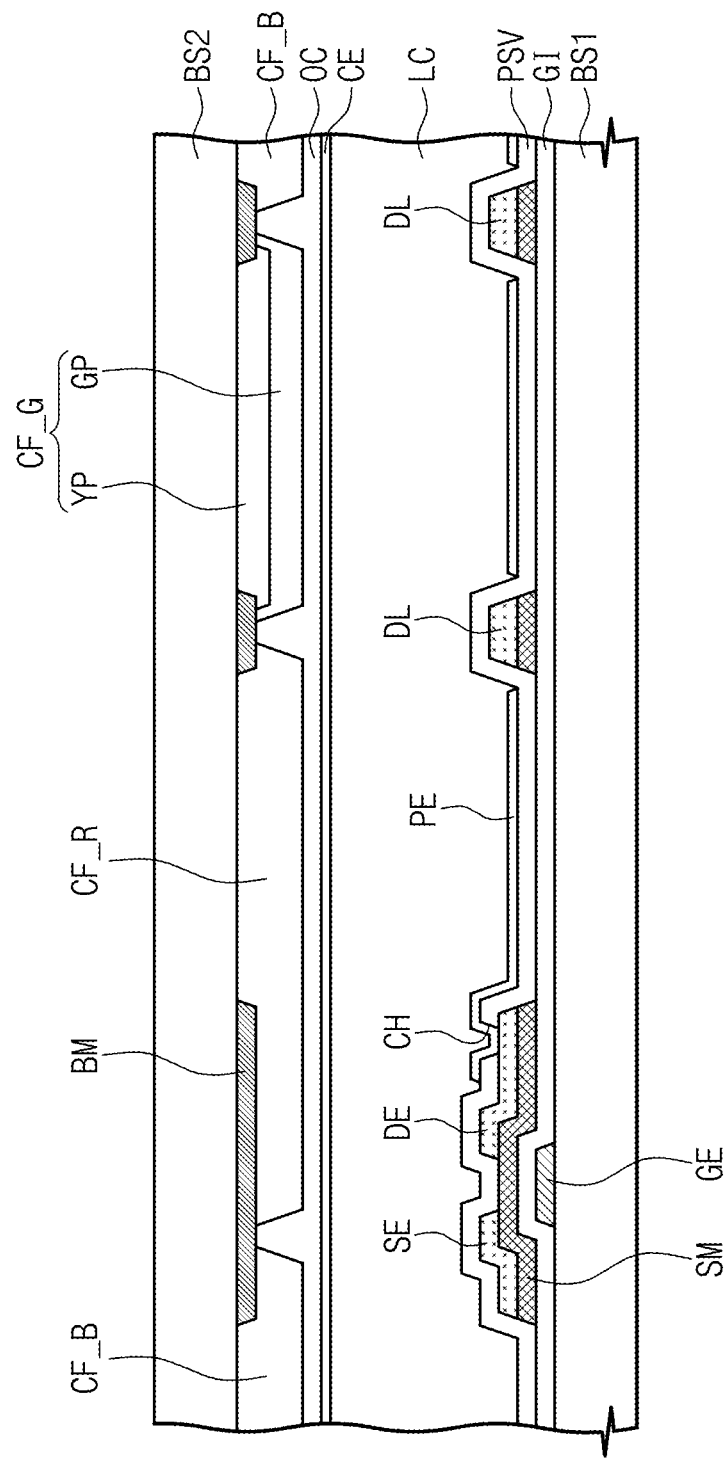
FIG. 3 is a cross-sectional view taken along a line I-I' of FIG. 2.

FIG. 1 is an exploded perspective view showing a liquid crystal display according to an example embodiment of the present disclosure, FIG. 2 is a plan view showing a portion of pixels shown in FIG. 1, and FIG. 3 is a cross-sectional view taken along a line I-I' of FIG. 2.

Referring to FIGS. 1 to 3, the liquid crystal display includes a first substrate SUB1, a second substrate SUB2 facing the first substrate SUB1, and a liquid crystal layer LC interposed between the first substrate SUB1 and the second substrate SUB2.

The first substrate SUB1 includes a first base substrate BS1, a plurality of gate lines GL, a plurality of data lines DL, and a plurality of pixels PXL.

The first base substrate BS1 has a substantially rectangular shape and includes a transparent insulating material, e.g., glass, crystal, plastic, etc.

The gate lines GL are disposed on the first base substrate BS1 and extend in one direction.

A gate insulating layer GI is disposed on the first base substrate BS1 on which the gate lines GL are formed. The gate insulating layer GI includes an insulating material, e.g., silicon nitride, silicon oxide, etc.

The data lines DL are disposed on the gate insulating layer GI and extend in a different direction crossing the one direction of the gate lines GL.

Each pixel PXL is connected to a corresponding gate line of the gate lines GL and a corresponding data line of the data lines DL. Each pixel PXL includes a thin film transistor TFT and a pixel electrode PE connected to the thin film transistor TFT. The thin film transistor TFT includes a gate electrode GE, the gate insulating layer GI, a semiconductor pattern SM, a source electrode SE, and a drain electrode DE.

The gate electrode GE is protruded from the gate line GL or formed on a portion of the gate line GL.

The gate electrode GE is formed of a metal material, such as, for example, nickel, chromium, molybdenum, aluminum, titanium, copper, tungsten, and alloy thereof. The gate electrode GE has a single-layer structure or a multiple-layer structure of the metal material. For instance, the gate electrode GE has a triple-layer structure of molybdenum-aluminum-molybdenum, which are sequentially stacked one on another, a double-layer structure of titanium and copper, which are sequentially stacked, or a single-layer structure of an alloy of titanium and copper.

The gate insulating layer GI is disposed over the entire surface of the first base substrate BS1 to cover the gate electrode GE and the gate line GL.

The semiconductor pattern SM is disposed on the gate insulating layer GI. The semiconductor pattern SM is disposed on the gate electrode GE and the gate insulating layer GI is disposed between the semiconductor pattern SM and the gate electrode GE. The semiconductor pattern SM is partially overlapped with the gate electrode GE. The semiconductor pattern SM includes, for example, amorphous silicon or crystalline silicon, but it should not be limited thereto or thereby. For instance, the semiconductor pattern SM may include a conductive organic material, e.g., oxide semiconductor. The semiconductor pattern SM includes an active pattern disposed on the gate insulating layer GI and an ohmic contact layer disposed on the active pattern. In this case, the active pattern includes an amorphous silicon thin layer and the ohmic contact layer includes an n+ amorphous silicon thin layer. The ohmic contact layer is disposed between a portion of the active pattern and the source electrode and between the other portion of the active pattern and the drain electrode. Due to the ohmic contact layer, the active pattern makes ohmic contact with the source electrode SE and the drain electrode DE.

The source electrode SE is branched from the data line DL. The source electrode SE is disposed on the semiconductor pattern SM and partially overlapped with the gate electrode GE.

The drain electrode DE is disposed to be spaced apart from the source electrode SE such that the semiconductor pattern SM is disposed between the source electrode SE and the drain electrode DE when viewed in a plan view. The drain electrode DE is disposed on the semiconductor pattern SM and partially overlapped with the gate electrode GE.

The source electrode SE and the drain electrode DE may include, for example, nickel, chromium, molybdenum, aluminum, titanium, copper, tungsten, or an alloy thereof. The source electrode SE and the drain electrode DE have a single-layer structure or a multiple-layer structure of the metal material. In detail, the source electrode SE and the drain electrode DE have a double-layer structure of titanium and copper, which are sequentially stacked one on another, or a single-layer structure of the alloy of titanium and copper.

Accordingly, an upper surface of the active pattern is exposed between the source electrode SE and the drain electrode DE, and a channel portion is formed between the source electrode SE and the drain electrode DE as a conductive channel in accordance with the application of voltage to the gate electrode GE. The source electrode SE and the drain electrode DE are overlapped with portions of the semiconductor pattern SM in areas except for the area in which the channel portion is formed between the source electrode SE and the drain electrode DE.

A passivation layer PSV is disposed on the thin film transistor TFT. The passivation layer PSV covers the channel portion to protect the channel portion. The passivation layer PSV is provided with a contact hole CH formed therethrough to expose a portion of the drain electrode DE.

The passivation layer PSV includes an organic insulating material or an inorganic insulating layer, e.g., silicon nitride, silicon oxide, etc.

The pixel electrode PE is disposed on the passivation layer PSV. The pixel electrode PE is connected to the drain electrode DE of the thin film transistor TFT through the contact hole CH.

The pixel electrode PE includes a transparent conductive material. In particular, the pixel electrode PE includes a transparent conductive oxide, e.g., indium tin oxide, indium zinc oxide, indium tin zinc oxide, etc.

The second substrate SUB2 includes a second base substrate BS2, a black matrix BM, and color filters.

The second base substrate BS2 has a substantially rectangular shape and includes a transparent insulating material, e.g., glass, crystal, plastic, etc.

The black matrix BM is disposed between the pixels PXL adjacent to each other. When, within each pixel PXL, an area in which the image is displayed is referred to as a display area and an area in which the image is not displayed is referred to as a non-display area, the black matrix BM is disposed in the non-display area. The gate line GL, the data line DL, and the thin film transistor TFT are disposed in the non-display area. The black matrix BM blocks an unnecessary light from traveling to the non-display area in which the gate line GL, the data line DL, and the thin film transistor TFT are disposed.

The color filters are disposed on the second base substrate BS2 to provide colors to light passing through the liquid crystal layer LC. An edge of each color filter is overlapped with the black matrix BM.

The color filters are positioned on the second substrate BS2 as color pixels over the pixels PXL on the first substrate BS1 in a one-to-one correspondence. The color pixels include a red color pixel CF_R, a green color pixel CF_G, and a blue color pixel CF_B. Each color pixel includes pigment or dye to provide the colors to the light.

In the present example embodiment, each color pixel has a single-layer structure except for the green color pixel CF_G.

The green color pixel CF_G includes a yellow portion YP disposed on the second base substrate BS2 and a green portion GP disposed on the yellow portion YP. The light passing through the green portion GP and the yellow portion YP has a green color. Each of the yellow portion YG and the green portion GP has a single-layer structure, and thus the green color pixel CF_G has a double-layer structure. The green portion GP is spaced apart from the second base substrate BS2 by the yellow portion YP, so that the green portion GP does not make contact with the second base substrate BS2.

The green portion GP has a thickness that is greater than that of the yellow portion YP. The yellow portion YP has the thickness of about 0.4 micrometers to about 1.0 micrometers and the green portion GP has the thickness of about 1.0 micrometers to about 1.5 micrometers. The thickness of the yellow portion YP may be adjusted as long as the light sequentially passing through the green portion GP and the yellow portion YP has the green color.

The yellow portion YP includes a yellow pigment. As the yellow pigment, at least one of C.I. pigment yellow 150 and C.I. pigment yellow 138, or a mixture pigment of C.I. pigment yellow 150 and C.I. pigment yellow 138 is used (herein, "C.I. pigment" refers to the Color Index International generic name). The C.I. pigment yellow 150 is represented by the following chemical formula 1 and the C.I. pigment yellow 138 is represented by the following chemical formula 2.

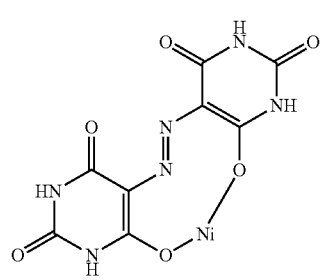

Chemical formula 1

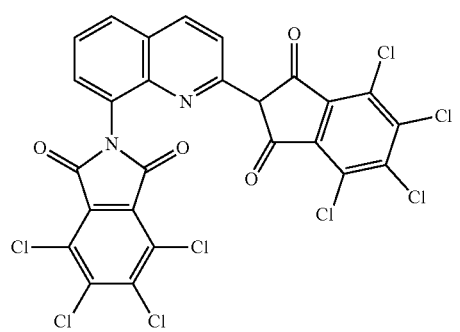

Chemical formula 2

The green portion GP includes a green pigment. As the green pigment, a halogenated phthalocyanine pigment is used.

The halogenated phthalocyanine pigment includes at least one of C.I. pigment green 58 and C.I. pigment green 36 or a mixture pigment of C.I. pigment green 58 and C.I. pigment green 36. The C.I. pigment green 58 is represented by the following chemical formula 3 and the C.I. pigment green 36 is represented by the following chemical formula 4.

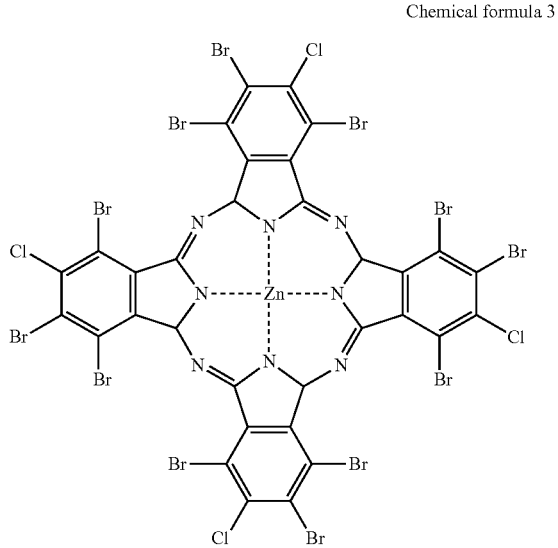

Chemical formula 3

Chemical formula 4

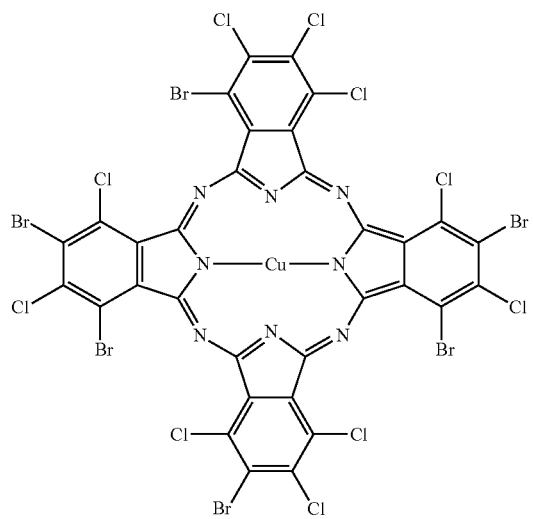

The end group of the pigment used in the green portion GP is substituted by a halogen atom. Therefore, when a laser beam is used to perform a repair process on a defective pixel in which a defect occurs, the halogen atom, especially bromine, is separated from the pigment and a radical is generated. Because the radical has high reactivity, the radical reacts with other molecules to produce impurities. For instance, the bromine reacts with liquid crystal molecules to produce impurities and the liquid crystal molecules are abnormally driven due to the impurities, thereby causing a light leakage. Further, when the liquid crystal molecules are usually alkenyl group or alkoxy group, the impurities are easily produced. The yellow portion YP blocks the laser beam so that the laser beam does not directly irradiate to the green portion GP, and thus the radical may be prevented from being produced in the green portion GP.

The red color pixel CF_R includes a red pigment and has a single-layer structure. As the red pigment, C.I. pigment red 105,C.I. pigment red 122,C.I. pigment red 149,C.I. pigment red 150, C.I. pigment red 155,C.I. pigment red 171,C.I. pigment red 175,C.I. pigment red 176,C.I. pigment red 177,C.I. pigment red 209,C.I. pigment red 224,C.I. pigment red 242, and C.I. pigment red 254 may be used. In the present example embodiment, C.I. pigment red 177 represented by the following chemical formula 5, C.I. pigment red 254 represented by the following chemical formula 6, or a mixture pigment of C.I. pigment red 177 and C.I. pigment red 254 may be used as the red pigment.

Chemical formula 5

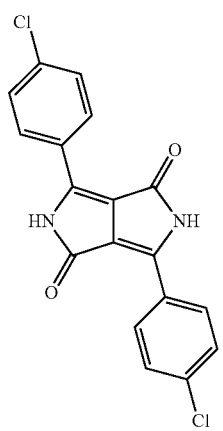

Chemical formula 6

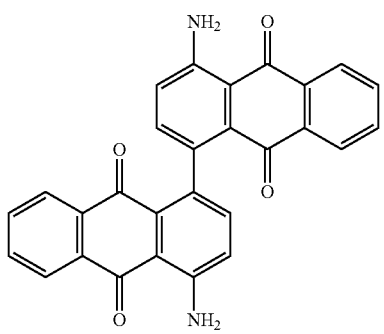

The blue color pixel CF_B includes a blue pigment and has a single-layer structure.

As the blue pigment, C.I. pigment blue 1,C.I. pigment blue 2,C.I. pigment blue 15,C.I. pigment blue 16,C.I. pigment blue 22,C.I. pigment blue 60,C.I. pigment blue 66,C.I. pigment blue 15:3, and C.I. pigment blue 15:6 may be used. In the present example embodiment, C.I. pigment blue 15:6 represented by the following chemical formula 7. A mixture of pigments containing C.I. pigment blue 15:6 may be used as the blue pigment.

Chemical formula 7

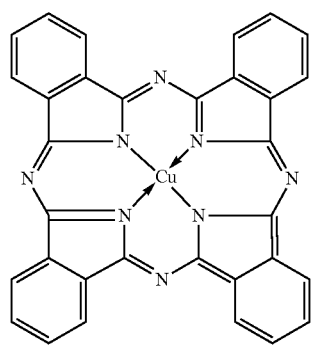

In the present example embodiment, the color filters include the red color pixel CF_R, the green color pixel CF_G, and the blue color pixel CF_B, but they should not be limited thereto or thereby. That is, the color filters may further include a magenta color pixel, a cyan color pixel, a yellow color pixel, and a white color pixel.

An overcoating layer OC is disposed on the color filters. The overcoating layer OC includes an insulating material and planarizes an upper surface of the color filters. The overcoating layer OC may be omitted.

The common electrode CE is disposed on the overcoating layer OC. The common electrode CE forms an electric field in cooperation with the pixel electrode PE to control the liquid crystal layer.

In the present example embodiment, the common electrode CE is disposed on the second base substrate BS2, but it should not be limited thereto or thereby. That is, the common electrode CE may be disposed on the first base substrate BS1. In this case, the common electrode CE is disposed to be spaced apart from the pixel electrode PE, and thus the common electrode CE is electrically insulated from the pixel electrode PE.

When a gate signal is applied to the gate line GL, the thin film transistor TFT is turned on. Thus, the data signal applied to the data line DL is applied to the pixel electrode PE through the turned-on thin film transistor TFT. When the data signal is applied to the pixel electrode PE through the thin film transistor TFT, the electric field is formed between the pixel electrode PE and the common electrode CE. In this case, a voltage applied to the pixel electrode PE is higher or smaller than a voltage applied to the common electrode CE. For instance, the voltage of about zero volts is applied to the common electrode CE and the voltage of about 7 volts is applied to the pixel electrode PE. The liquid crystal molecules in the liquid crystal layer LC are driven by a voltage difference between the voltage applied to the common electrode CE and the voltage applied to the pixel electrode PE. Accordingly, the amount of the light passing through the liquid crystal layer LC is changed, and thus a desired image is displayed.

Hereinafter, a method of manufacturing the liquid crystal display will be described in detail with reference to FIGS. 1 to 3.

The liquid crystal display according to the present example embodiment may be manufactured by preparing the first and second substrates SUB1 and SUB2 and forming the liquid crystal layer LC between the first and second substrates SUB1 and SUB2.

The first substrate SUB1 is manufactured by forming the gate lines GL, the data lines DL, and the pixels PXL connected to the gate lines GL and the data lines DL on the first base substrate BS1.

In more detail, a gate line part including the gate electrode GE and the gate line GL is formed on the first base substrate BS1. The gate line part is formed by depositing a first conductive layer on the first base substrate BS1 and patterning the first conductive layer through a photolithography process.

The gate insulating layer GI is formed on the gate line part.

Then, a semiconductor material and a second conductive layer are sequentially deposited on the gate insulating layer GI and patterned using a photolithography process, and thus a data line part including the semiconductor pattern SM, the source electrode SE, the drain electrode DE, and the data line DL is formed.

The passivation layer PSV is formed on the data line part. The contact hole CH is formed through the passivation layer PSV to expose the portion of the drain electrode DE. The contact hole CH may be formed by a photolithography process.

The pixel electrode PE is formed on the passivation layer PSV. The pixel electrode PE is formed by depositing a third conductive layer on the passivation layer PSV and patterning the third conductive layer using a photolithography process.

The second substrate SUB2 is manufactured by forming the black matrix BM, the color filters, and the common electrode CE on the second base substrate BS2.

FIGS. 4A to 4F are cross-sectional views showing a manufacturing method of the second substrate according to an example embodiment of the present disclosure.

Referring to FIG. 4A, the black matrix BM is formed on the second base substrate BS2. The black matrix BM is formed in areas corresponding to the line parts (gate lines GL and data lines DL) of the first substrate and the thin film transistors. The black matrix BM is formed by using a light-blocking material, e.g., carbon, titanium oxide, iron oxide, or a mixture thereof, but it should not be limited thereto or thereby. The black matrix BM is formed by forming the material on the second base substrate BS2 and patterning the material using a photolithography process.

The color filters are formed on the black matrix BM. In the color filters, the forming order of the red color pixel CF_R, the green color pixel CF_G, and the blue color pixel CF_B should not be limited to a specific order. In the present example embodiment, the color filters are formed in the order of the red color pixel CF_R, the green color pixel CF_G, and the blue color pixel CF_B, but they should not be limited thereto or thereby. Each color pixel may be formed by an inkjet process, a slit coating process, or a photolithography process. In the case that each color pixel is formed by the coating processes, each color pixel may be formed by preparing a color pixel solution containing each pigment and solvent, providing the color pixel solution to a desired position, and curing the color pixel solution to remove the solvent. In the case that each color pixel is formed by the photolithograph process, each color pixel may be formed by preparing a color pixel solution containing the pigment and solvent and having photosensitivity, providing the color pixel solution to a desired position, partially curing the color pixel solution to remove the solvent, and exposing and developing the cured color pixel solution.

Referring to FIG. 4B, the red color pixel CF_R is formed. The red color pixel CF_R has a single-layer structure and the edge of the red color pixel CF_R is overlapped with the black matrix BM.

Referring to FIGS. 4C and 4D, the green color pixel CF_G is formed. The green color pixel CF_G is formed by forming the yellow portion YP having a single-layer structure and forming the green portion GP having a single-layer structure on the yellow portion YP. The yellow portion YP covers the entire surface of the pixel in which the green color pixel CF_G is formed, and the edge of the yellow portion YP is overlapped with the black matrix BM. Therefore, although the green portion GP is formed on the yellow portion YP, the green portion GP does not make contact with the second base substrate BS2.

Referring to FIG. 4E, the blue color pixel CF_B is formed. The blue color pixel CF_B has a single-layer structure.

Figure 4G:
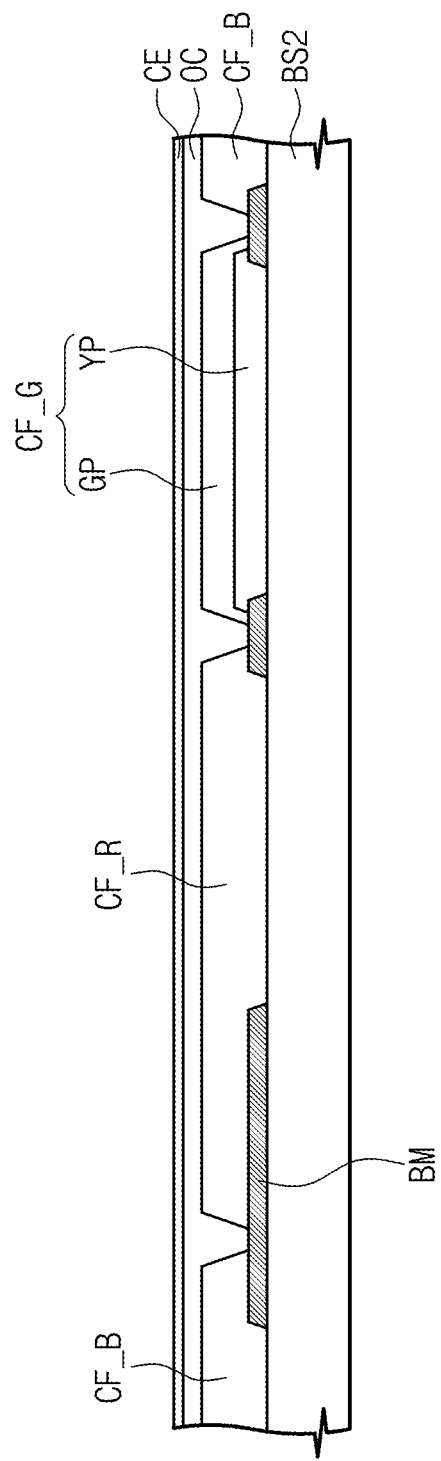

Then, as shown in FIGS. 4F and 4G, the overcoating layer OC and the common electrode CE are sequentially formed on the second base substrate BS2 on which each color pixel is formed. The overcoating layer OC and the common electrode CE may be formed using a deposition process.

The liquid crystal display may be easily repaired using a laser beam when a defective pixel occurs. The defective pixel means the pixel abnormally operated and is caused by defects, e.g., short or opening in the gate and data line parts, abnormal structure in the thin film transistor or the pixel electrode.

Figure 5A:
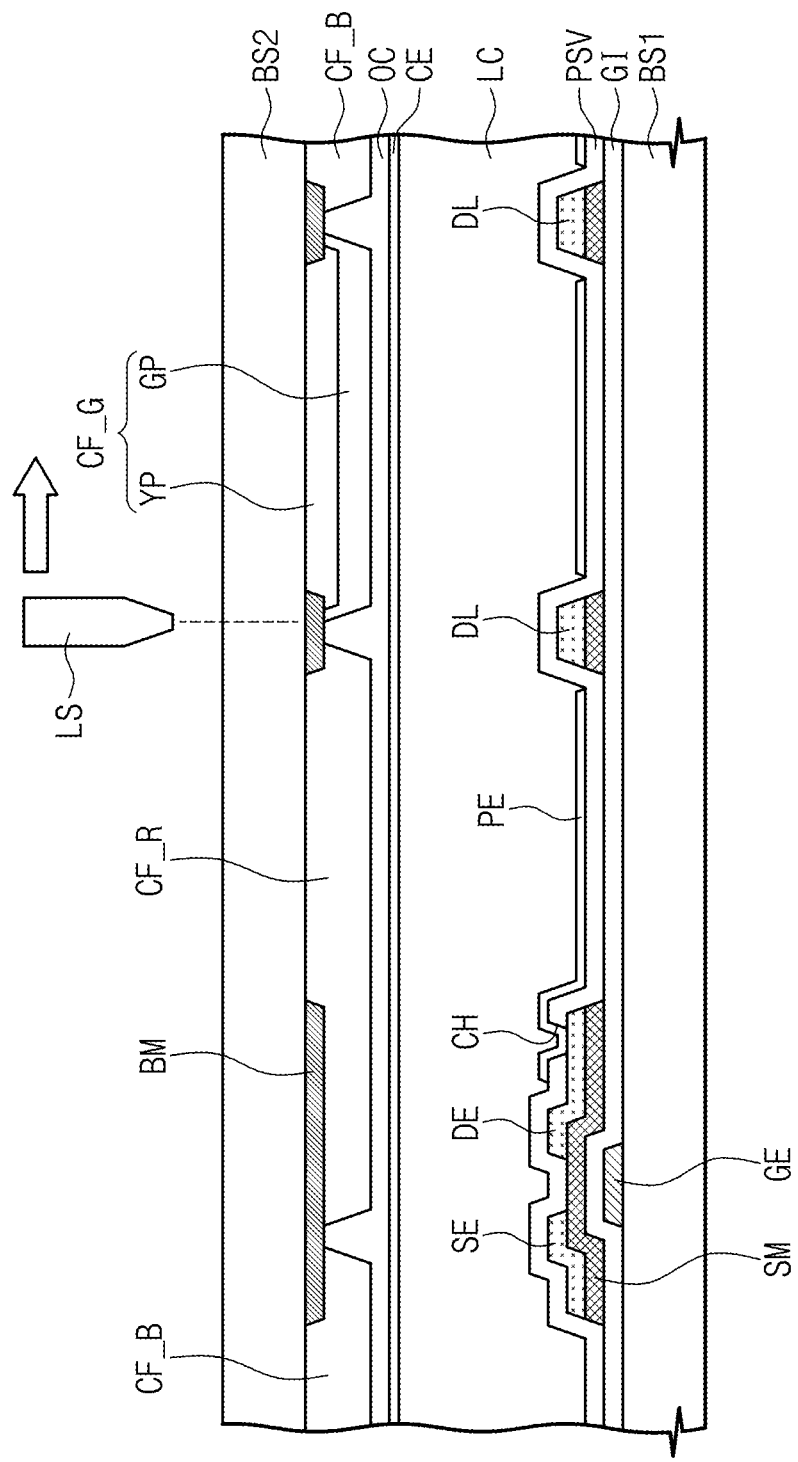
Figure 5B:
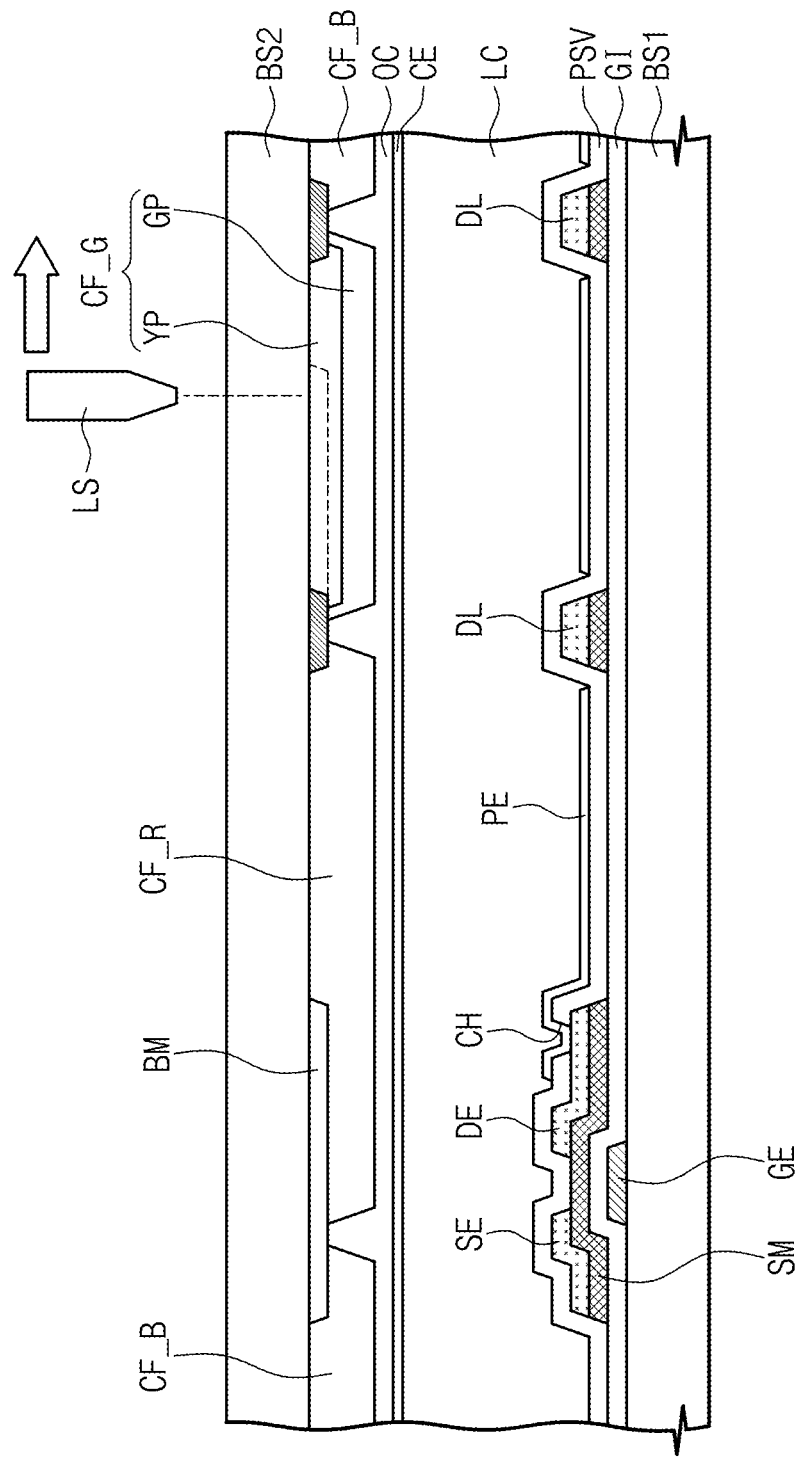

FIGS. 5A to 5C are cross-sectional view showing a repairing method of a defective pixel in the liquid crystal display according to an example embodiment of the present disclosure. In FIGS. 5A to 5C, the pixel corresponding to the green color pixel will be described as the defective pixel.

Although not shown in figures, an inspection process is performed to determine whether the defective pixel exists or not. The inspection process is performed in various ways. As an example, a position of the defective pixel is found by realizing a test pattern on the screen of the display panel and checking a portion at which a bright or dark point appears.

Then, the defective pixel becomes a black point using the laser beam. The process of blackening the defective pixel may be performed by irradiating the black matrix with the laser beam to expand the area of the black matrix. To this end, as shown in FIGS. 5A and 5B, the portion between the second base substrate BS2 and corresponding color filters is irradiated with the laser beam LS to form a gap, which is indicated by a dotted line in FIG. 5B, between the second base substrate BS2 and the corresponding color filters. The corresponding color filters are oxidized or reduced by the laser beam LS. As a result, a void is defined between the second base substrate BS2 and the corresponding color filters. In the present example embodiment, the gap is defined between the yellow portion YP of the green color pixel CF_G and the second base substrate BS2. The gap is formed by continuously irradiating the area between black matrices that are adjacent to each other.

Referring to FIG. 5C, the laser beam LS is applied to the black matrix BM disposed adjacent to the gap to fill the gap with the black matrix BM. Accordingly, the black matrix BM is expanded to the entire area of the color pixel and is overlapped with the color filter, and thus the color filter corresponding to the defective pixel is completely covered. The portion overlapped with the corresponding color filter is referred to as a repair portion, to be distinct from the black matrix BM. The repair portion corresponds to at least one pixel of the pixels and may be provided to every defective pixel. The repair portion is disposed between the second base substrate BS and the color filter corresponding to the defective pixel. That is, the repair portion may be provided between the second base substrate BS2 and the red color pixel CF_R, between the second base substrate BS2 and the green color pixel CF_G, and between the second base substrate BS2 and the blue color pixel CF_B. In the case of the green color pixel CF_G, the repair portion may be disposed between the second base substrate BS2 and the yellow portion YP.

As described above, because the repair portion that covers the corresponding color filter is formed in the defective pixel, the light passing through the color pixel is blocked. Thus, the defective pixel always displays a black color regardless of the application of the voltages to the pixel electrode PE and the common electrode CE.

The repair method using the laser beam may be performed on the red, green, and blue color pixels. According to the present example embodiment, driving defects in the pixels adjacent to the green color pixel may be reduced when the defective pixel corresponding to the green color pixel is repaired. In addition, a voltage holding ratio of the adjacent pixels may be prevented from being dropped when the defective pixel corresponding to the green color pixel is repaired. Hereinafter, the driving defects in the adjacent pixels and the drop of the voltage holding ratio, which are prevented, will be described in detail In the case that the halogenated phthalocyanine pigment represented by the above chemical formulas 3 and 4 is used as the color filter material of the green color pixel and directly exposed to the laser beam (that is, there is no yellow portion YP or other protective layer) in the liquid crystal display, the halogen radical, e.g., the bromine radical, may be produced from the phthalocyanine color pixel as represented by the following chemical formula 8.

Chemical formula 8

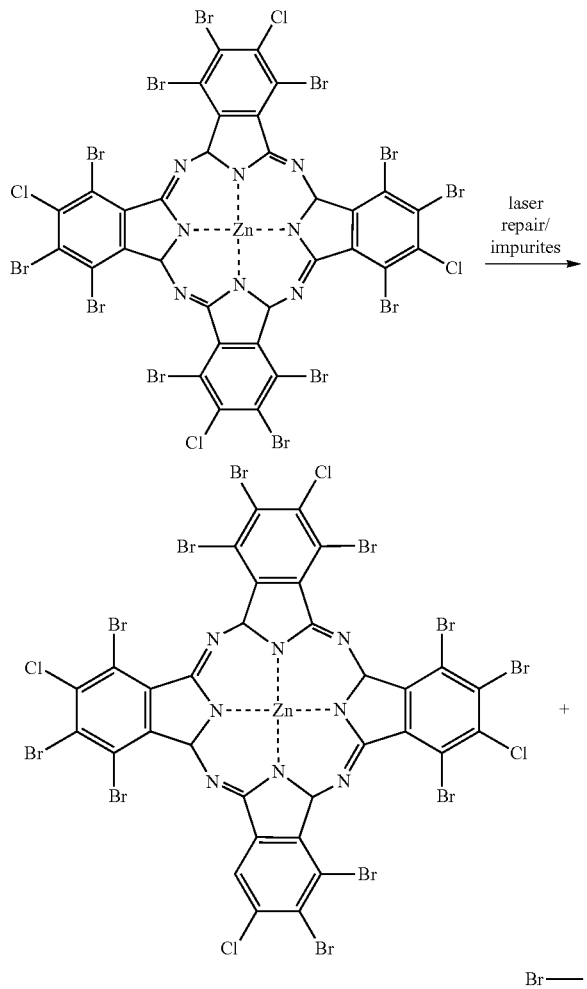

The halogen radical reacts with surrounding molecules having high reactivity, and thus the impurities are produced. Specifically, the halogen radical chain-reacts with alkenyl liquid crystal molecules or alkoxy liquid crystal molecules. The following chemical formula 9 shows the radical reaction, and a polar material is formed due to the radical reaction. The polar material may additionally react with residual ions in the liquid crystal layer, and thus the impurities are produced.

In the following chemical formula 9, portions of the liquid crystal molecule are indicated by "R" except for a reactor.

Chemical formula 9

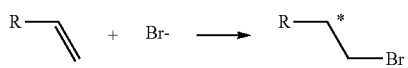

-continued

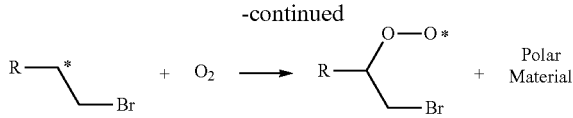

The product of the radical reaction including the liquid crystal molecules may be diffused through the liquid crystal layer to the areas corresponding to the adjacent pixels, and thus not only the defective pixel but also the pixels adjacent to the defective pixel do not operate normally. In addition, the product of the radical reaction including the liquid crystal molecules reduces the voltage holding ratio of each pixel.

Table 1 shows whether or not the pixels adjacent to the defective pixel are normally operated when the green color pixel has only the single-layer structure of the green pigment and the defective pixel is repaired in each color pixel. Here, a compared example 1 indicates a liquid crystal display employing a liquid crystal layer that does not contain the alkenyl liquid crystal molecules and compared examples 2 to 4 indicate a liquid crystal display employing a liquid crystal layer that contains the alkenyl liquid crystal molecules having high reactivity. In addition, "NG" indicates a case that one or more adjacent pixels are not normally operated in each liquid crystal display and "OK" indicates a case that all adjacent pixels are normally operated except for the defective pixel. Further, a fraction in "NG" indicates a rate of adjacent pixels that are not normally operated in all inspected liquid crystal displays.

TABLE 1

| Number of Test | Compared example 1 | | | Compared example 2 | | | Compared example 3 | | | Compared example 4 | | |
|---|---|---|---|---|---|---|---|---|---|---|---|---|
| | green | red | blue | green | red | blue | green | red | blue | green | red | blue |
| 1 | OK | OK | OK | OK | OK | OK | OK | OK | OK | OK | OK | OK |
| 2 | NG | OK | OK | NG(2/3) | OK | OK | NG(2/3) | OK | OK | NG | OK | OK |
| 3 | NG | OK | OK | NG | OK | OK | NG | OK | OK | NG | OK | OK |
| 4 | NG | OK | OK | NG | OK | OK | NG(2/3) | OK | OK | NG(1/3) | OK | OK |

As represented in Table 1, in the case of the liquid crystal display employing the liquid crystal layer containing the alkenyl liquid crystal molecules having high reactivity, the driving defect occurs of the adjacent pixels only when the green color pixel is repaired.

Table 2 shows the dropping value of the voltage holding ratio in accordance with a kind of the pigment applied to each color pixel when the blue, green, and red color pixels have the single-layer structure of the blue, green, and red pigments, respectively. The dropping value of the voltage holding ratio indicates a difference value between the voltage holding ratio measured at a temperature of about 60 degrees before each color pixel is repaired and the voltage holding ratio of the pixels respectively corresponding to the repaired color pixels at a temperature of about 60 degrees after the color pixels are repaired by using the laser beam.

TABLE 2

| Pigment (C.I. pigment) | Halogen end-group in pigment | Dropping value of voltage holding ratio |
|---|---|---|
| Blue pigment (blue 15:6) | Non-exist | 1.94 |
| Green pigment 1 (green 36) | Exist | 25.27 |
| Green pigment 2 (green 58) | Exist | 25.31 |
| Red pigment 1 (red 254) | Exist | 12.37 |
| Red pigment 2 (red 177) | Non-exist | 1.61 |

As represented in Table 2, the voltage holding ratio is varied depending on the existence of the halogen end-group in the pigments of the color pixels. When the halogen end-group does not exist, the voltage holding ratio of the blue pigment is dropped by about 1.94 and the voltage holding ratio of the red pigment 2 is dropped by about 1.61. However, the voltage holding ratio of the red pigment 1 having the halogen end-group is dropped by about 12.37, the voltage holding ratio of the green pigment 1 having the halogen end-group is dropped by about 25.27, and the voltage holding ratio of the green pigment 2 having the halogen end-group is dropped by about 25.31.

When the green color pixel has the double-layer structure of the yellow portion and the green portion according to the present example embodiment, the driving defects in the adjacent pixels are not generated after the defective pixels corresponding to the color pixels are repaired.

In addition, as represented in the following Table 3, when the green color pixel has the double-layer structure of the yellow portion and the green portion, the voltage holding ratio is smaller than about 3 regardless of the existence of the halogen end-group in the yellow pigment of the yellow portion.

TABLE 3

| Pigment (C.I. pigment) | Halogen end-group in pigment | Dropping value of voltage holding ratio |
|---|---|---|
| Yellow pigment 1 (yellow 150) | Non-exist | 2.64 |
| Yellow pigment 2 (yellow 138) | exist | 1.69 |

As represented in Table 3, when the green color pixel has the double-layer structure of the yellow portion and the green portion, the voltage holding ratio may be prevented from being dropping due to the green pigment after the defective pixel is repaired.

Although the example embodiments of the present invention have been described, it is understood that the present invention should not be limited to these example embodiments but various changes and modifications can be made by one ordinary skilled in the art within the spirit and scope of the present disclosure including the following claims.

The invention claimed is:

1. A liquid crystal display comprising:
a first substrate including a plurality of pixels;
a second substrate facing the first substrate, the second substrate comprising a base substrate, a plurality of color filters disposed on the base substrate, and a black matrix disposed between the color filters; and
a liquid crystal layer disposed between the first substrate and the second substrate,
wherein each of the plurality of color filters is positioned over a corresponding pixel among the plurality of pixels,
wherein the plurality of color filters comprises a red color pixel displaying a red color, a green color pixel displaying a green color, and a blue color pixel displaying a blue color,
wherein the green color pixel comprises a yellow portion that is disposed on the base substrate and includes a yellow pigment and a green portion that is disposed on the yellow portion and includes a green pigment, and wherein the green portion contacts the black matrix without contacting the base substrate.

2. The liquid crystal display of claim 1, wherein the yellow portion comprises at least one of pigments represented by the following chemical formulas 1 and 2

Chemical formula 1

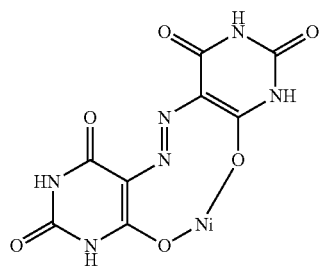

Chemical formula 2

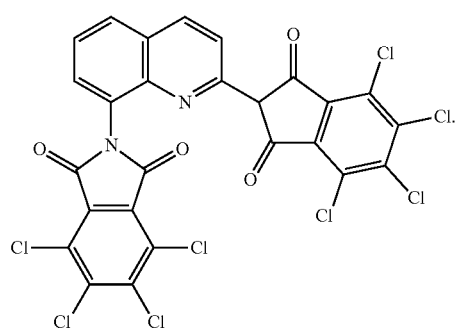

3. The liquid crystal display of claim 2, wherein the green portion comprises a halogenated phthalocyanine pigment.

4. The liquid crystal display of claim 3, wherein the halogenated phthalocyanine pigment comprises at least one of pigments represented by the following chemical formulas 3 and 4

Chemical formula 3

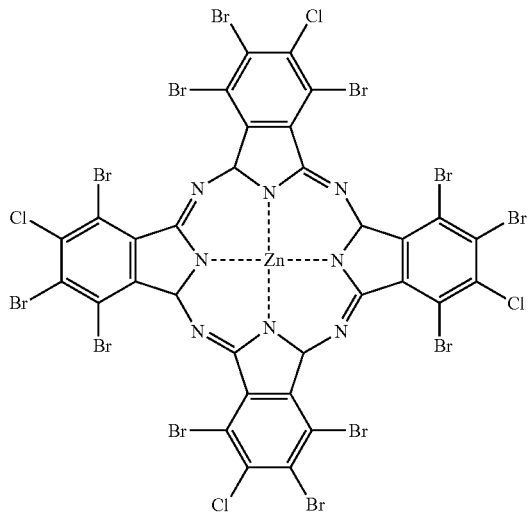

Chemical formula 4

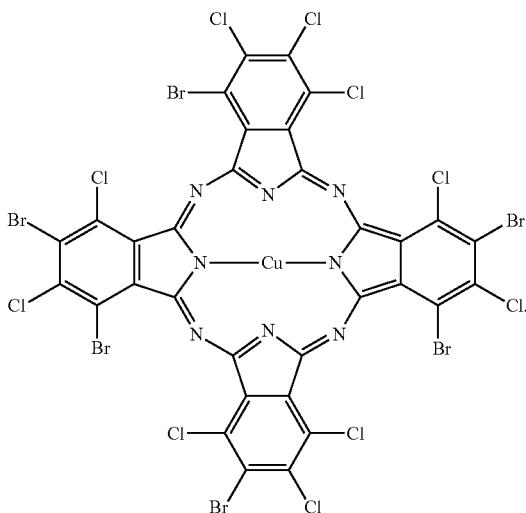

5. The liquid crystal display of claim 1, wherein the green portion has a thickness greater than a thickness of the yellow portion.

6. The liquid crystal display of claim 1, wherein the yellow portion has the thickness of about 0.5 micrometers to about 1.0 micrometers and the green portion has the thickness of about 1.0 micrometers to about 1.5 micrometers.

7. The liquid crystal display of claim 1, wherein each of the red color pixel and the blue color pixel has a single-layer structure.

8. The liquid crystal display of claim 1, wherein the liquid crystal layer comprises alkenyl liquid crystal molecules.

9. A method of repairing the liquid crystal display as recited in claim 1, the method comprising:
identifying a defective pixel in the plurality of pixels; and
covering the color filter corresponding to the defective pixel using the black matrix.

10. The method of claim 9, wherein the covering of the color filter using the black matrix comprises:
applying a laser beam to a region between the base substrate and the color filter to form a gap between the base substrate and the color filter; and applying the black matrix disposed adjacent to the gap to fill the gap with the black matrix.

11. A method of manufacturing a liquid crystal display, comprising:
forming a first substrate including a plurality of pixels;
forming a second substrate; and
forming a liquid crystal layer between the first substrate and the second substrate, the forming of the second substrate comprising:
forming a black matrix on a base substrate; and
forming a plurality of color filters on the base substrate, the color filters including a red color pixel, a green color pixel, and a blue color pixel, the forming of the green color pixel comprising:
forming a yellow portion including a yellow pigment directly on the base substrate; and
forming a green portion including a green pigment covering the yellow portion and contacting the black matrix without contacting the base substrate.

12. The method of claim 11, wherein the color filters are formed by an inkjet method, a coating method, or a photolithography method.

13. The method of claim 11, wherein the yellow portion comprises at least one of pigments represented by the following chemical formulas 1 and 2

Chemical formula 1

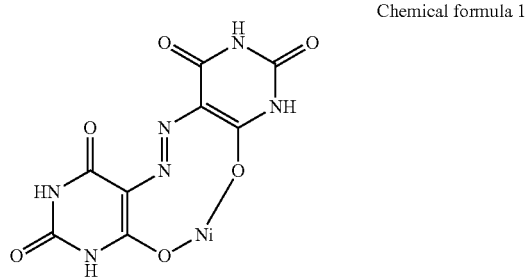

Chemical formula 2

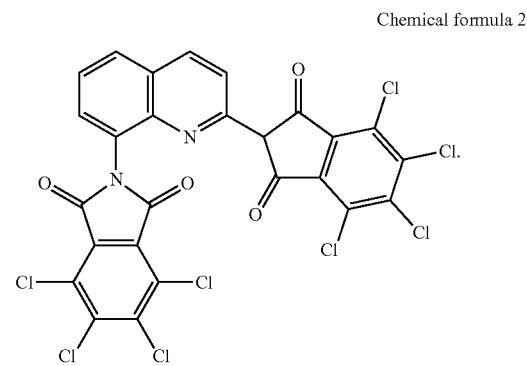

14. The method of claim 13, wherein the green portion comprises a halogenated phthalocyanine pigment.

15. The method of claim 14, wherein the halogenated phthalocyanine pigment comprises at least one of pigments represented by the following chemical formulas 3 and 4

Chemical formula 3

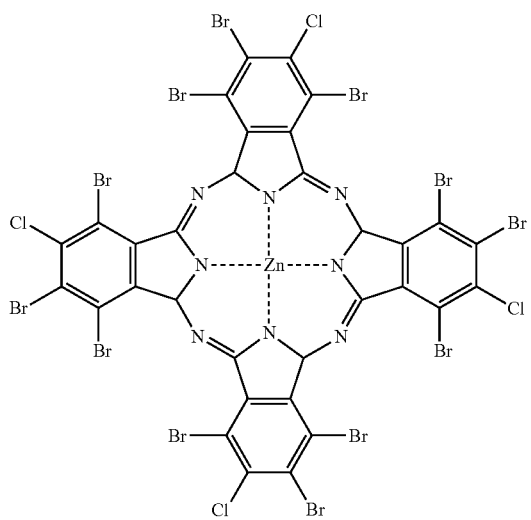

Chemical formula 4

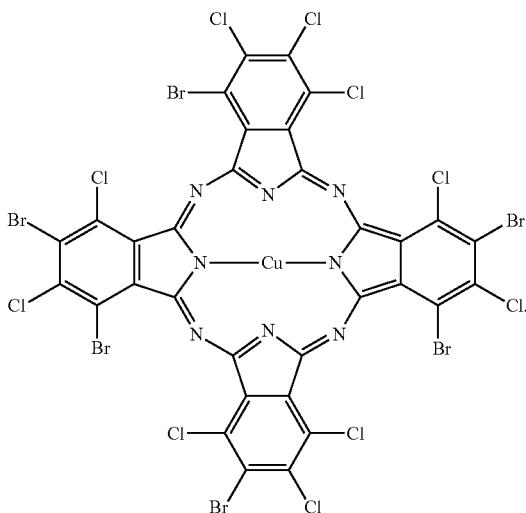

16. The method of claim 11, wherein the green portion has a thickness greater than a thickness of the yellow portion.

17. The method of claim 11, wherein the yellow portion has the thickness of about 0.5 micrometers to about 1.0 micrometers and the green portion has the thickness of about 1.0 micrometers to about 1.5 micrometers.

18. The method of claim 11, wherein each of the red color pixel and the blue color pixel has a single-layer structure.

19. The method of claim 11, wherein the liquid crystal layer comprises alkenyl liquid crystal molecules.

20. A liquid crystal display comprising:
a first substrate including a plurality of pixels;
a second substrate facing the first substrate; and
a liquid crystal layer disposed between the first substrate and the second substrate, the second substrate comprising:
a base substrate;
a plurality of color filters disposed on the base substrate, each color filter positioned on the second substrate over a respectively corresponding pixel;
a black matrix disposed between the color filters; and
a repair portion overlapped with at least one of the color filters and including a same material as the black matrix, wherein the color filters include a red color pixel displaying a red color, a green color pixel displaying a green color, and a blue color pixel displaying a blue color, wherein the green color pixel comprises a yellow portion that is disposed on the base substrate and includes a yellow pigment and a green portion that is disposed on the yellow portion and includes a green pigment, and
wherein the liquid crystal layer includes alkenyl liquid crystal molecules.

21. The liquid crystal display of claim 20, wherein the repair portion is disposed between the base substrate and the overlapped color filter.

22. The liquid crystal display of claim 20, wherein the yellow portion comprises at least one of pigments represented by the following chemical formulas 1 and 2

Chemical formula 1

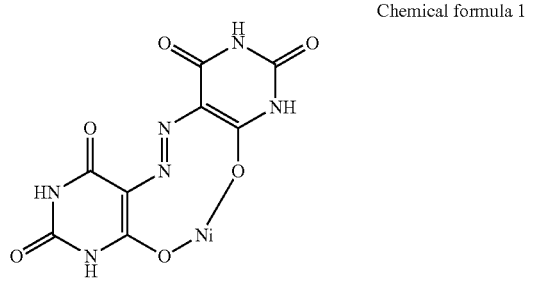

Chemical formula 2

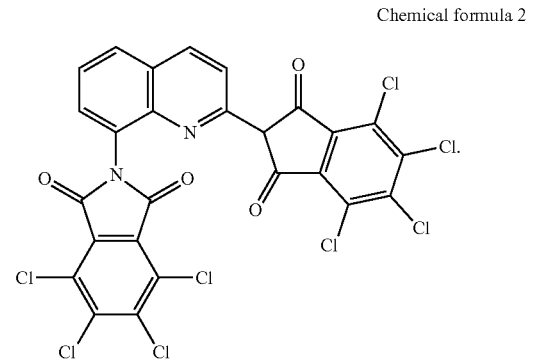

23. The liquid crystal display of claim 20, wherein the green portion comprises a halogenated phthalocyanine pigment.

24. The liquid crystal display of claim 23, wherein the halogenated phthalocyanine pigment comprises at least one of pigments represented by the following chemical formulas 3 and 4

Chemical formula 3

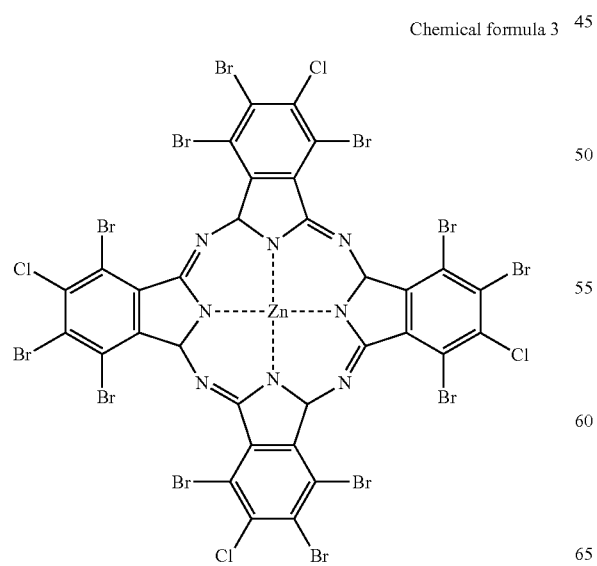

-continued

Chemical formula 4

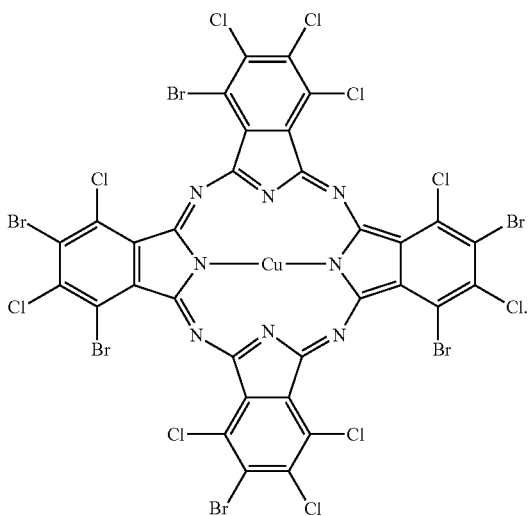

25. The liquid crystal display of claim 20, wherein the green portion contacts the black matrix without contacting the base substrate.

26. The liquid crystal display of claim 20,
wherein the yellow pigment is represented by the following chemical formula 2, and
wherein the green pigment is represented by the following chemical formula 3:

Chemical formula 2

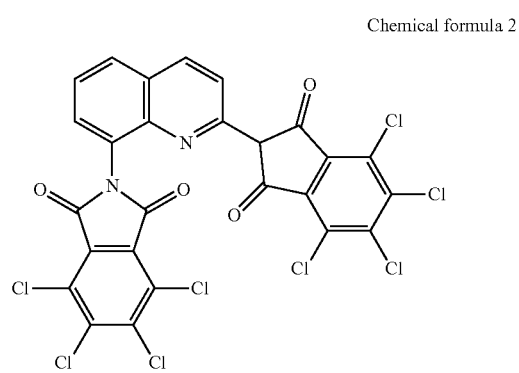

Chemical formula 3

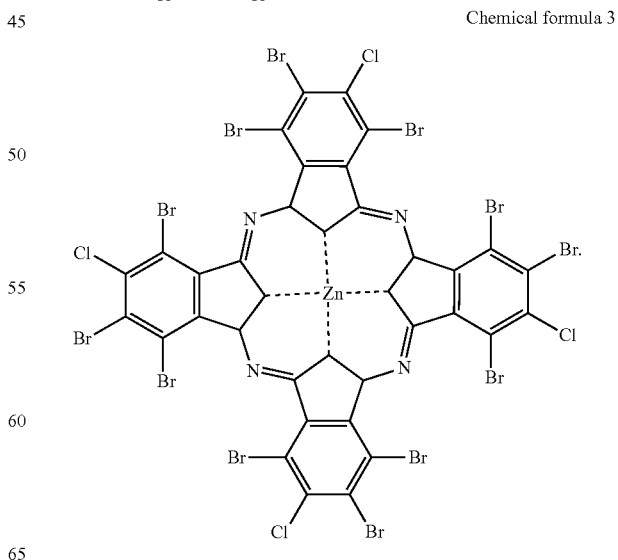

* * * * *